(12) United States Patent
Asami et al.

(10) Patent No.: US 8,525,714 B2
(45) Date of Patent: Sep. 3, 2013

(54) TEST APPARATUS AND TEST METHOD FOR A/D CONVERTER

(75) Inventors: Koji Asami, Tokyo (JP); Yasuo Furukawa, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 13/414,611

(22) Filed: Mar. 7, 2012

(65) Prior Publication Data

US 2012/0229314 A1   Sep. 13, 2012

(30) Foreign Application Priority Data

Mar. 10, 2011   (JP) .................................. 2011-052805

(51) Int. Cl.
*H03M 1/06* (2006.01)
(52) U.S. Cl.
USPC ............................ 341/118; 341/120; 341/155

(58) Field of Classification Search
USPC .......................... 341/118, 120, 155, 156, 133
See application file for complete search history.

(56) References Cited

U.S. PATENT DOCUMENTS

| | | | |
|---|---|---|---|
| 6,531,972 B2 * | 3/2003 | Variyam et al. | 341/120 |
| 7,471,224 B2 * | 12/2008 | Babbitt et al. | 341/133 |
| 7,574,309 B2 * | 8/2009 | Strittmatter | 702/57 |
| 7,634,376 B2 * | 12/2009 | Strittmatter | 702/117 |

* cited by examiner

*Primary Examiner* — Jean B Jeanglaude
(74) *Attorney, Agent, or Firm* — Ladas & Parry, LLP

(57) ABSTRACT

A test apparatus configured to test an N-bit (N represents an integer) A/D converter is provided. A voltage generating unit outputs a $2^N$-valued analog voltage to the A/D converter. A capture unit captures an output code of the A/D converter for each level. A signal processing unit compares the output code captured for each level with the corresponding expected value code, corrects the value of the analog voltage for each level based upon the comparison result, and outputs the corrected analog voltage to the voltage generating unit.

11 Claims, 8 Drawing Sheets

TEST APPARATUS AND TEST METHOD FOR A/D CONVERTER

CROSS-REFERENCE TO RELATED APPLICATIONS

This application claims to priority to Japanese Patent Application No. 2011-052805 filed on Mar. 10, 2011 the disclosure of which is incorporated herein by reference in its entirety.

BACKGROUND OF THE INVENTION

1. Field of the Invention

The present invention relates to a technique for testing an A/D converter.

2. Description of the Related Art

A/D converters are employed in order to convert an analog voltage into a digital code. An ideal A/D converter generates a digital code that changes linearly with respect to an analog voltage. However, in some cases, an actual A/D converter has a problem of conversion error. This leads to a problem in that the digital code does not linearly follow the analog voltage.

FIGS. 1A and 1B are diagrams for describing nonlinear error that occurs in a 3-bit A/D converter. The conversion characteristics of an ideal A/D converter are represented by the broken line (I). As indicated by the solid line (II) in FIG. 1A, the conversion characteristics of an actual A/D converter involve conversion error. In FIG. 1A, the digital code $D_{OUT}$ monotonically increases with respect to the analog voltage $V_{IN}$ over the entire range, and all the digital codes $D_{OUT}$ can be generated. In contrast, in some cases, as shown in FIG. 1B, a particular digital code $D_{OUT}$ cannot be generated, and the digital code $D_{OUT}$ does not increase monotonically with respect to the analog voltage $V_{IN}$.

In order to test whether or not an A/D converter has desired performance according to its specifications, differential nonlinearity (DNL), integral nonlinearity (INL), or the like is measured. FIG. 2 is a block diagram which shows a test system 1002 for an A/D converter according to a comparison technique. An arbitrary waveform generator 1010 supplies an analog voltage $V_{IN}$ having a waveform (ramp waveform) that changes in a stepwise manner to an A/D converter which is a device under test (DUT) 1. Subsequently, a capture unit 1020 captures the relation between the analog voltage $V_{IN}$ and the digital output $D_{OUT}$ of the A/D converter, and detects the analog voltage $V_{IN}$ at which the digital code $D_{OUT}$ changes. With such an arrangement, the conversion characteristics are measured as shown in FIGS. 1A and 1B.

With such a test system 1002, the number of steps of the analog voltage $V_{IN}$ having a ramp waveform is set to be greater than the number of steps (the number of codes) of the A/D converter. Specifically, there is a need to change the analog voltage $V_{IN}$ in increments of steps, the number of which is 8 to 16 times the number of steps of the A/D converter 1. Thus, such a conventional test system 1002 requires a very long test time.

Furthermore, the input voltage range (full scale voltage range) of the A/D converter 1 involves a margin of error. Thus, there is a need to design the full scale voltage range of the analog voltage $V_{IN}$ to be wider than the design value of the input voltage range of the A/D converter 1. This leads to a further increased test time. Such a long test time means that there is an increase in the test cost. Thus, there is a demand for a test system which requires only a short test time.

SUMMARY OF THE INVENTION

The present invention has been made in order to solve such a problem. Accordingly, it is an exemplary purpose of an embodiment of the present invention to provide a reduction in an A/D converter test time.

An embodiment of the present invention relates to a test apparatus for an N-bit (N represents an integer) A/D converter. The test apparatus comprises: a voltage generating unit configured to output a $2^N$-valued analog voltage to the A/D converter; a capture unit configured to capture an output code for each level output from the A/D converter; and a signal processing unit configured to compare the output code captured for each level with a corresponding expected value code, to correct the value of an analog voltage for each level based upon the comparison result, and to output the corrected analog voltage to the voltage generating unit.

The test apparatus is configured to repeatedly execute processing in which the analog voltage is corrected every time the output code of the A/D converter is captured, and processing in which the output code of the A/D converter with respect to the corrected analog voltage is captured. Thus, the analog voltage of each level asymptotically approaches the corresponding threshold voltage of the A/D converter. With such an embodiment, the number of times capturing is performed is smaller than with conventional test apparatuses, thereby providing a reduced test time.

Also, in the i-th (i represents an integer) correction, the analog voltage to be supplied in the (i+1)-th correction for a given level may be reduced or otherwise is increased according to the comparison result between the output code captured for this level and the corresponding expected value code.

Also, in the initial state, each difference between adjacent levels in the analog voltage may be set to a constant value, i.e., $\Delta V$. Also, the signal processing unit may be configured to execute an i-th (i represents an integer) correction in which the analog voltage to be supplied in the (i+1)-th correction for a given level is reduced or otherwise is increased by $\Delta V / 2^i$ based upon comparison result between the output code captured for this level and the corresponding expected value code.

With conventional apparatuses, a total number of times capturing must be performed so as to detect the respective transition points (threshold voltages) with a resolution of $\frac{1}{2}^{M-1}$ LSB is $2^N \times 2^{M-1}$. In contrast, with the present embodiment, such an arrangement requires capturing of the output code to be performed only ($2^N \times M$) times.

Also, the signal processing unit may be configured to repeatedly perform the correction for the analog voltage until a desired resolution is obtained.

Also, the voltage generating unit may comprise: a main voltage source configured to generate a $2^N$-valued reference analog voltage in which the voltage difference between adjacent levels is set to $\Delta V$; a sub-voltage source configured to generate a correction voltage that corresponds to a correction amount determined for each level by means of the signal processing unit; and an adder configured to add the reference analog voltage and the correction voltage so as to output a corrected analog voltage.

Also, the voltage generating unit may be configured to generate the $2^N$-valued analog voltage such that it increases monotonically.

Also, the voltage generating unit may be configured to generate the $2^N$-valued analog voltage in a scrambled manner.

Such an arrangement allows an A/D converter to be tested under stricter conditions.

Another embodiment of the present invention relates to a test method for an N-bit (N represents an integer) A/D converter. The test method comprises: outputting a $2^N$-valued analog voltage to the A/D converter each time incrementing a variable i (i represents an integer); capturing an output code for each level output from the A/D converter; and comparing the output code captured for each level with a corresponding expected value code, and correcting the value of the analog voltage for each level according to the comparison result. With such an arrangement, the aforementioned processing is repeatedly executed.

It is to be noted that any arbitrary combination or rearrangement of the above-described structural components and so forth is effective as and encompassed by the present embodiments. Moreover, this summary of the invention does not necessarily describe all necessary features so that the invention may also be a sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

The invention will now be described based on preferred embodiments which do not intend to limit the scope of the present invention but exemplify the invention. All of the features and the combinations thereof described in the embodiment are not necessarily essential to the invention.

In the present specification, the state represented by the phrase "the member A is connected to the member B" includes a state in which the member A is indirectly connected to the member B via another member that does not affect the electric connection therebetween, in addition to a state in which the member A is physically and directly connected to the member B. Similarly, the state represented by the phrase "the member C is provided between the member A and the member B" includes a state in which the member A is indirectly connected to the member C, or the member B is indirectly connected to the member C via another member that does not affect the electric connection therebetween, in addition to a state in which the member A is directly connected to the member C, or the member B is directly connected to the member C.

Figure 3:
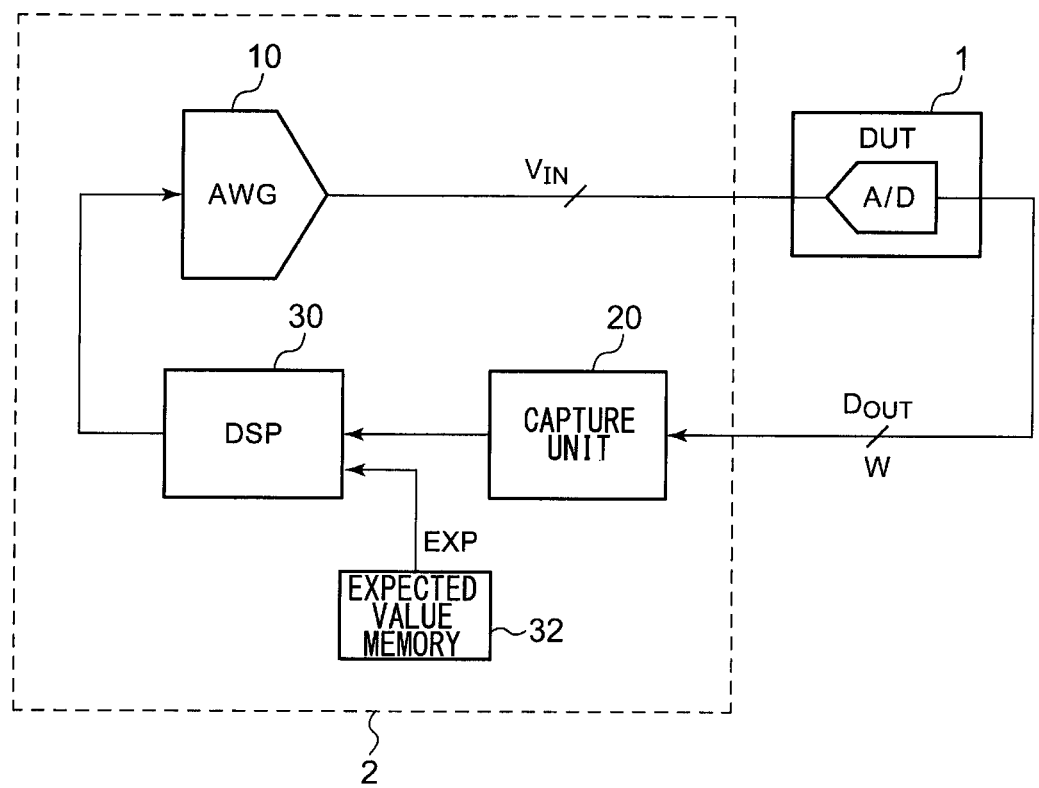
FIG. 3 is a block diagram which shows a configuration of a test apparatus according to an embodiment.

FIG. 3 is a block diagram which shows a configuration of a test apparatus 2 according to an embodiment. An A/D converter (which will also be referred to as a "DUT") 1, which is to be tested, is connected to the test apparatus 2. The DUT 1 is an A/D converter configured to quantize an input analog voltage $V_{IN}$, and to convert the input analog voltage $V_{IN}$ thus quantized into an N-bit (N represents an integer) digital code $D_{OUT}$.

The test apparatus 2 is configured to supply an analog test signal (analog voltage) $V_{IN}$ to the DUT 1, to judge the analog voltage at which the digital code $D_{OUT}$ changes, i.e., the reference threshold voltage of the A/D converter, so as to measure nonlinear error (INL, DNL). Description will be made regarding a specific configuration of the test apparatus 2.

The test apparatus 2 includes a voltage generating unit 10, a capture unit 20, and a signal processing unit 30. The voltage generating unit 10 is configured to output a $2^N$-valued analog voltage $V_{IN}$. The analog voltage $V_{IN}$ of the j-th level ($1 \leq i \leq 2^N$) will be represented by $V_{IN}(j)$ hereafter. The voltage generating unit 10 can be configured as an arbitrary waveform generator (AWG) or otherwise a D/A converter.

The capture unit 20 is configured to capture the output code $D_{OUT}(j)$ of the A/D converter 1 when the j-th level (j=1 to $2^N$) analog input signal is input. Expected value memory 32 stores expected value codes EXP (1 to $2^N$) for the respective levels. Specifically, the expected value EXP(j) for the j-th level is represented by a decimal number (j−1). The expected value code EXP may be generated by an internal component of the signal processing unit 30. In this case, such an arrangement does not require the expected memory 32.

The signal processing unit 30 is configured to compare the output code $D_{OUT}(j)$ captured for each level with the corresponding expected code EXP(j), and to correct the analog voltage $V_{IN}(j)$ for each level based upon the comparison result. The signal processing unit 30 instructs the voltage generating unit 10 to output the corrected analog voltage $V_{IN}$, and the digital code $D_{OUT}$ that is generated as a result is captured by the capture unit 20.

The above is the basic configuration of the test apparatus 2. The test apparatus 2 is configured to repeatedly perform an operation in which the test apparatus 2 corrects the analog voltage $V_{IN}$ every time it captures the output code $D_{OUT}$ of the A/D converter 1, and then captures the output code $D_{OUT}$ of the A/D converter 1 corresponding to the analog voltage $V_{IN}$ thus corrected. As a result, the analog voltage $V_{IN}$ of each level asymptotically approaches the corresponding transition point, i.e., the corresponding threshold voltage of the A/D converter 1. The signal processing unit 30 repeatedly performs correction of the analog voltage $V_{IN}$ M times until a desired resolution is obtained. With such a test apparatus 2, the number of times capturing is performed to detect the respective transition points of the A/D converter 1 is smaller than it is with conventional test apparatuses, thereby providing a reduced test time.

Next, specific description will be made regarding signal processing suitable for the test apparatus 2.

Figure 1A:
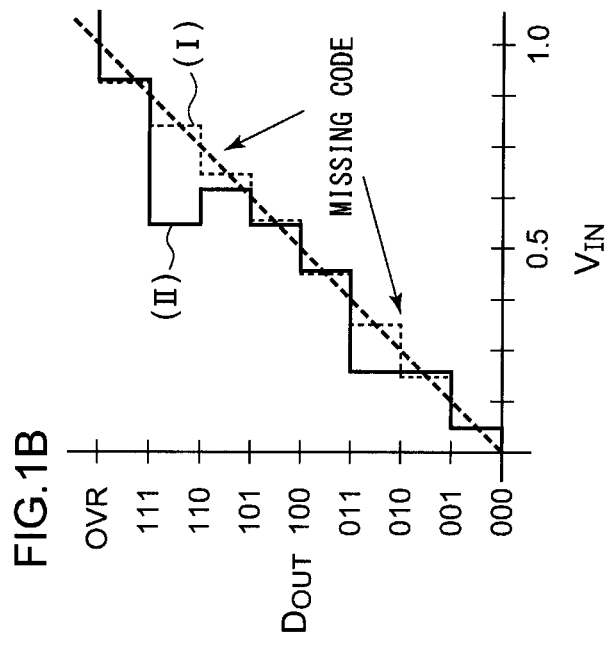
FIGS. 1A and 1B are diagrams each showing nonlinear error that occurs in a 3-bit A/D converter.
Figure 1B:
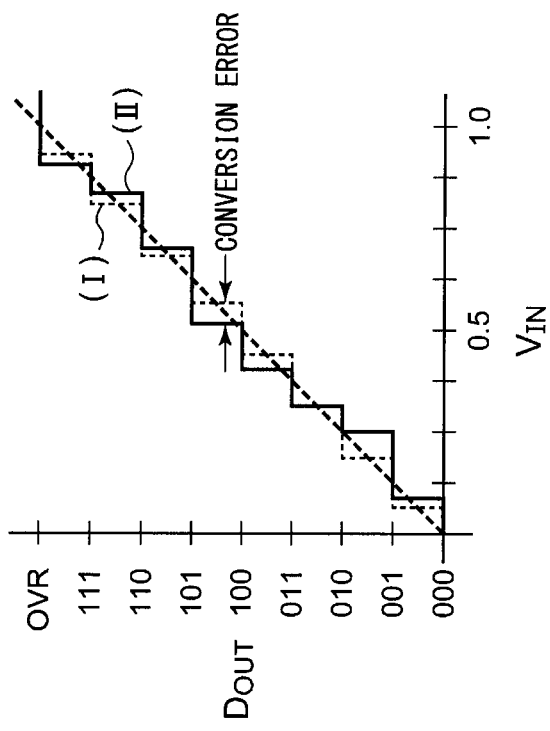
Figure 2:
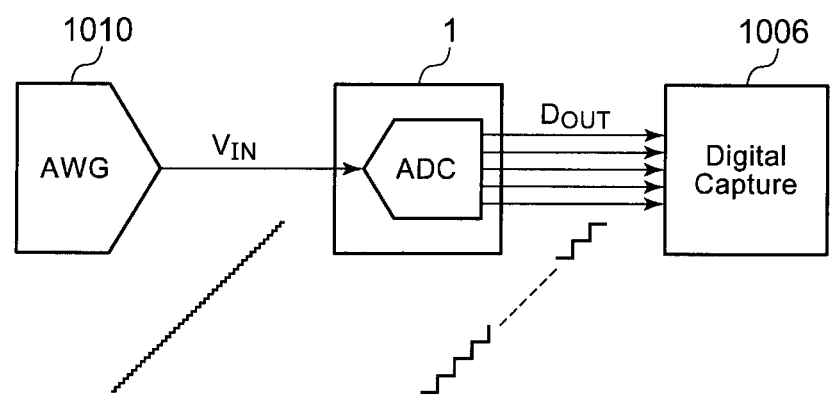
FIG. 2 is a block diagram which shows a test system for an A/D converter according to a comparison technique.
Figure 4:
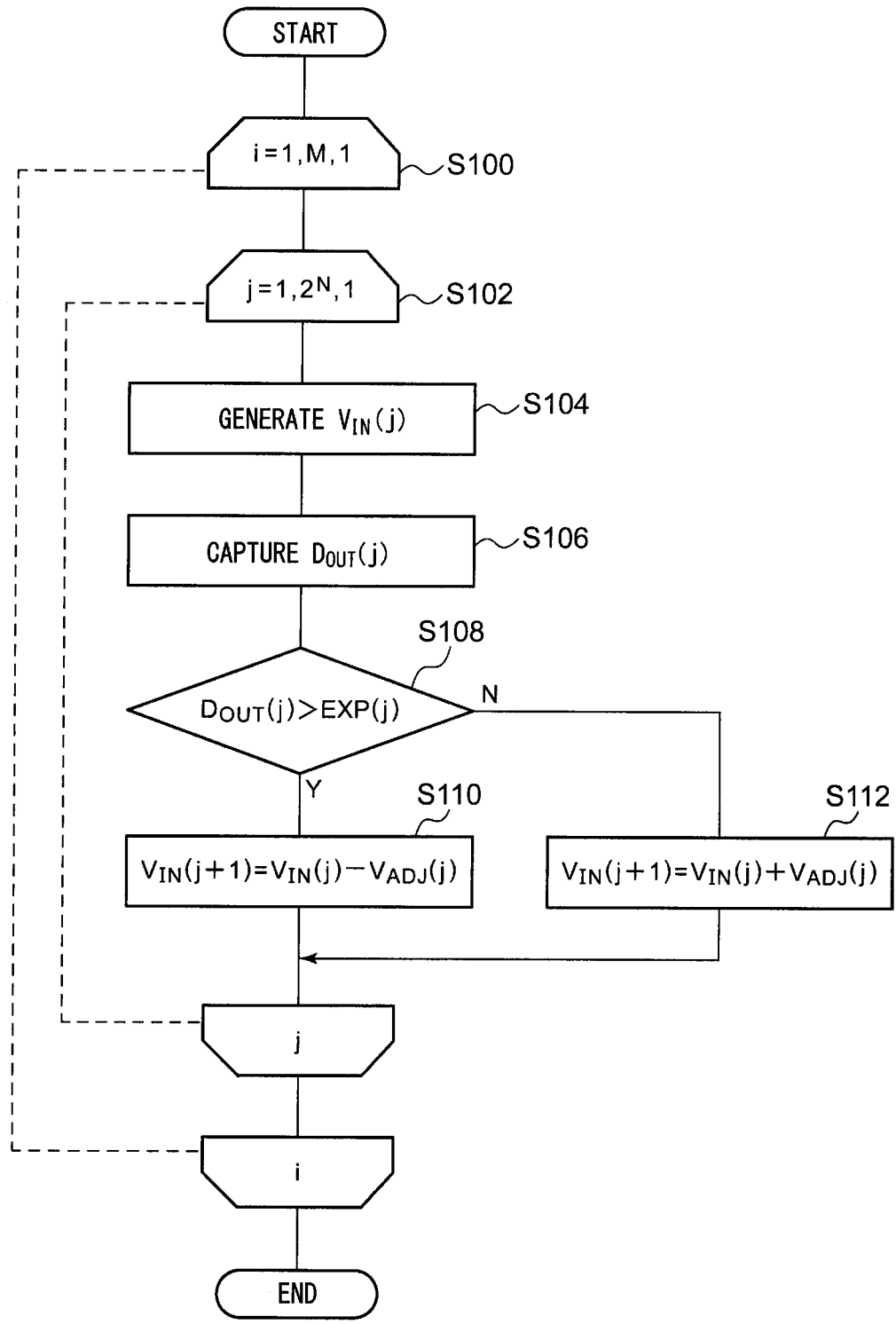
FIG. 4 is a flowchart which shows a test method employed by the test apparatus shown in FIG. 2.

FIG. 4 is a flowchart which shows a test method employed by the test apparatus 2 shown in FIG. 2.

The signal processing unit 30 repeatedly performs correction M times, each time incrementing the variable i by 1 (S100). In the i-th correction, the signal processing unit 30 performs correction for each of the levels 1 through $2^N$, each time incrementing the variable j by 1 (S102).

In the i-th (i represents an integer) correction, the voltage generating unit 10 generates the analog voltage $V_{IN}(j)$ (S104). Subsequently, the output code $D_{OUT}(j)$ that corresponds to the analog voltage $V_{IN}(j)$ is captured (S106).

When the output code $D_{OUT}(j)$ thus captured corresponding to the j-th level is greater than the corresponding expected value code EXP(j) (YES in S108), the analog voltage $V_{IN}(j)$ for the j-th level that is to be applied in the (i+1)-th correction is reduced by a correction voltage $V_{AJD}(j)$ (S110). Conversely, when the output code $D_{OUT}(j)$ thus captured corresponding to the j-th level is equal to or smaller than the corresponding expected value code EXP(j) (NO in S108), the analog voltage $V_{IN}(j)$ for the j-th level that is to be applied in the (i+1)-th correction is increased by a correction voltage $V_{AJD}(j)$ (S112). It should be noted that Steps S110 and S112 each represent a step in which the analog voltage $V_{IN}(j)$ which is to be used in the next (i+1)-th cycle is calculated. In Step S104, the analog voltage $V_{IN}(j)$ thus calculated in Step S110 or S112 is generated in actuality, and the analog voltage $V_{IN}(j)$ thus generated is applied to the DUT 1.

In an embodiment, the signal processing unit 30 performs binary searching. In the initial state (i=1), each voltage difference between the adjacent levels in the analog voltage $V_{IN}$ (1 to $2^N$) is set to be a constant value, i.e., $\Delta V$. Here, $\Delta V$ may be a voltage that corresponds to the design value of 1 LSB set for the A/D converter 1. In the i-th (i represents an integer) correction, when the output code $D_{OUT}(j)$ captured for the j-th level is greater than the corresponding expected value code EXP(j), the signal processing unit 30 reduces, by $V_{AJD}(j) = \Delta V/2^i$, the analog voltage $V_{IN}(j)$ for the j-th level that is to be applied in the (i+1)-th correction. Conversely, when the output code $D_{OUT}(j)$ thus captured is equal to or smaller than the corresponding expected value code EXP(j), the signal processing unit 30 increases, by $V_{AJD}(j) = \Delta V/2^i$, the analog voltage $V_{IN}(j)$ for the j-th level that is to be applied in the (i+1)-th correction.

The $2^N$-valued analog voltage $V_{IN}$ (1 to $2^N$) generated by the voltage generating unit 10 may have a desired waveform. For example, the voltage generating unit 10 may generate such a $2^N$-valued analog voltage $V_{IN}$ (1 to $2^N$) such that it increases monotonically over time. In this case, the analog voltage $V_{IN}$ (1 to $2^N$) has a ramp waveform which increases in a stepwise manner.

Figure 5A:
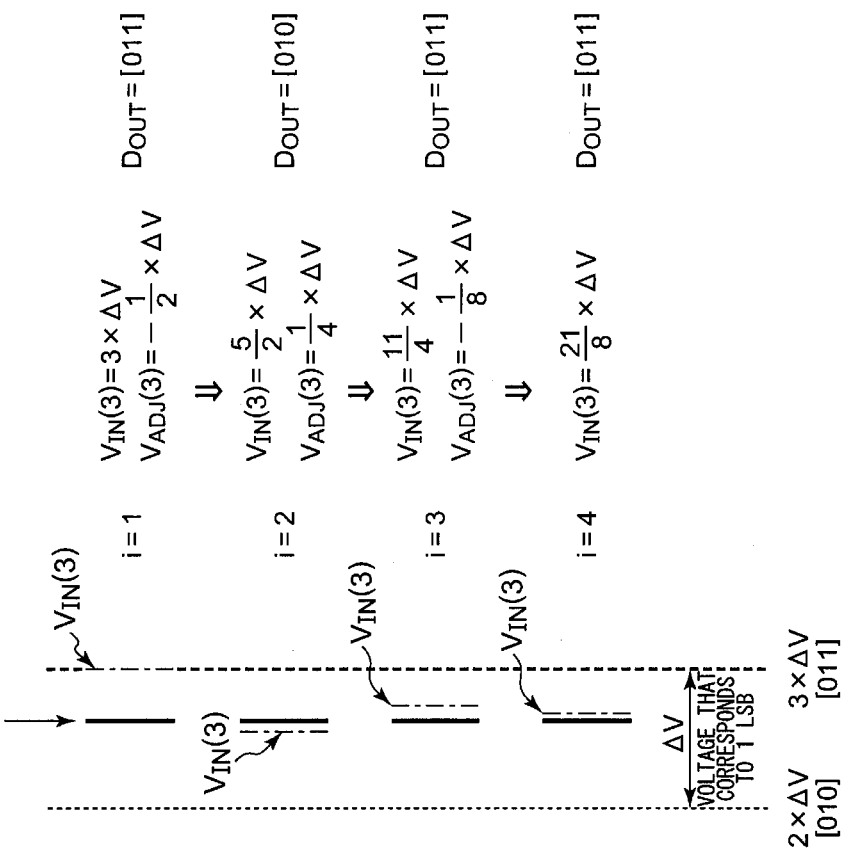
FIGS. 5A and 5B are diagrams each showing the operation of the test apparatus.
Figure 5B:
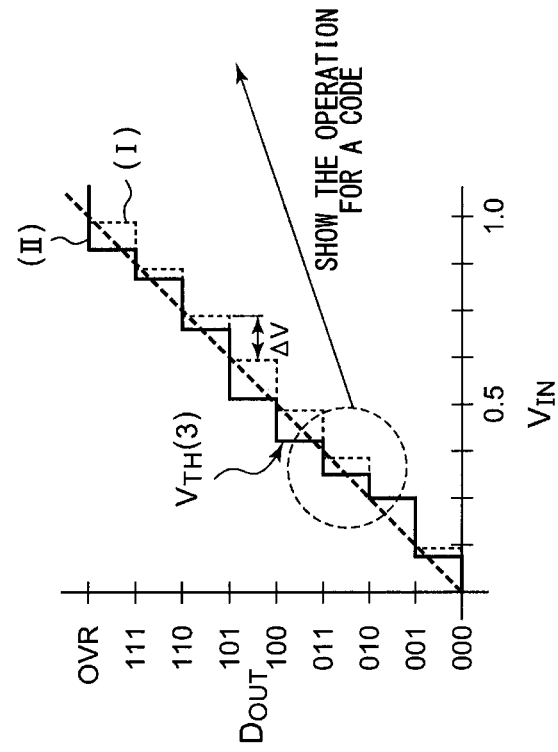

The above is a specific signal processing operation of the test apparatus 2. FIGS. 5A and 5B are diagrams for describing the operation of the test apparatus 2. Let us say that the A/D converter 1 is configured as a 3-bit A/D converter having an input voltage range of 0 to 1 V. In FIG. 5A, the broken line (I) indicates the input/output characteristics of an ideal A/D converter, and the solid line (II) indicates input/output characteristics of an A/D converter that involve conversion error. As described above, the purpose of the test apparatus 2 is to detect the threshold voltages $V_{TH}(1)$ through $V_{TH}(8)$ for the respective codes indicated by the solid line (II).

Description will be made directing attention to the processing for the third level, i.e., detection of the threshold voltage $V_{TH}(3)$ that defines the boundary between the codes $D_{OUT}$=[010] and [011]. FIG. 5B is a diagram which shows the processing for detecting the threshold voltage $V_{TH}(3)$, which defines the boundary between the codes [010] and [011]. In this processing, the expected value code EXP(3) is represented by the decimal number 2 (=3−1). Thus, the expected value code EXP(3) is represented by [010]. In FIG. 5B, the solid line indicates the threshold voltage $V_{TH}(3)$ to be detected, and the line of dashes and dots indicates the input voltage $V_{IN}(3)$, which is corrected for each cycle.

For example, in the first correction, $V_{IN}(3)=3\times\Delta V$ is input as the initial value. In this stage, the output code $D_{OUT}$ is [011], which is greater than the expected value code [010]. Accordingly, the input voltage $V_{IN}$ to be applied in the subsequent second correction is lowered by $\Delta V/2$. In the second correction, the output code $D_{OUT}$ is [010], which is equal to or smaller than the expected value code [010], and accordingly, the input voltage $V_{IN}$ to be applied in the subsequent third correction is raised by $\Delta V/4$. It can be understood that, in such a manner, the analog voltage $V_{IN}$ asymptotically approaches the threshold voltage $V_{TH}(3)$ every time the correction for the analog voltage $V_{IN}(3)$ is repeated.

With such an arrangement configured to perform such an operation, by repeating performance of the correction twice, such an arrangement provides a resolution of ½ LSB. Furthermore, by repeating performance of the correction three times, such an arrangement provides a resolution of ¼ LSB. That is to say, by repeating performance of the correction M times, such an arrangement is capable of testing the DUT 1 with a resolution of $½^{M-1}$ LSB.

With the conventional test system 1002 shown in FIG. 2, in a case in which an analog voltage $V_{IN}$ having a ramp waveform is employed, such an arrangement requires capturing of the digital code $D_{OUT}$ to be performed M times for each level to provide a resolution of (1/M) LSB. That is to say, for all the levels, such a conventional test system 1002 requires capturing of the digital code $D_{OUT}$ to be performed ($2^N \times M$) times.

For example, such a conventional system requires capturing to be performed ($2^N \times 8$) times to provide a resolution of ⅛ LSB. In contrast, with the test apparatus 2 according to the embodiment, such an arrangement requires that the correction be repeated only four times to provide the same resolution. Such an arrangement requires capturing to be performed only ($2^N \times 4$) times, thereby providing a dramatically reduced test time.

Description has been made regarding the present invention with reference to the embodiments. The above-described embodiment has been described for exemplary purposes only, and is by no means intended to be interpreted restrictively. Rather, it can be readily conceived by those skilled in this art that various modifications may be made by making various combinations of the aforementioned components or processes, which are also encompassed in the technical scope of the present invention. Description will be made below regarding such modifications.

Figure 6:
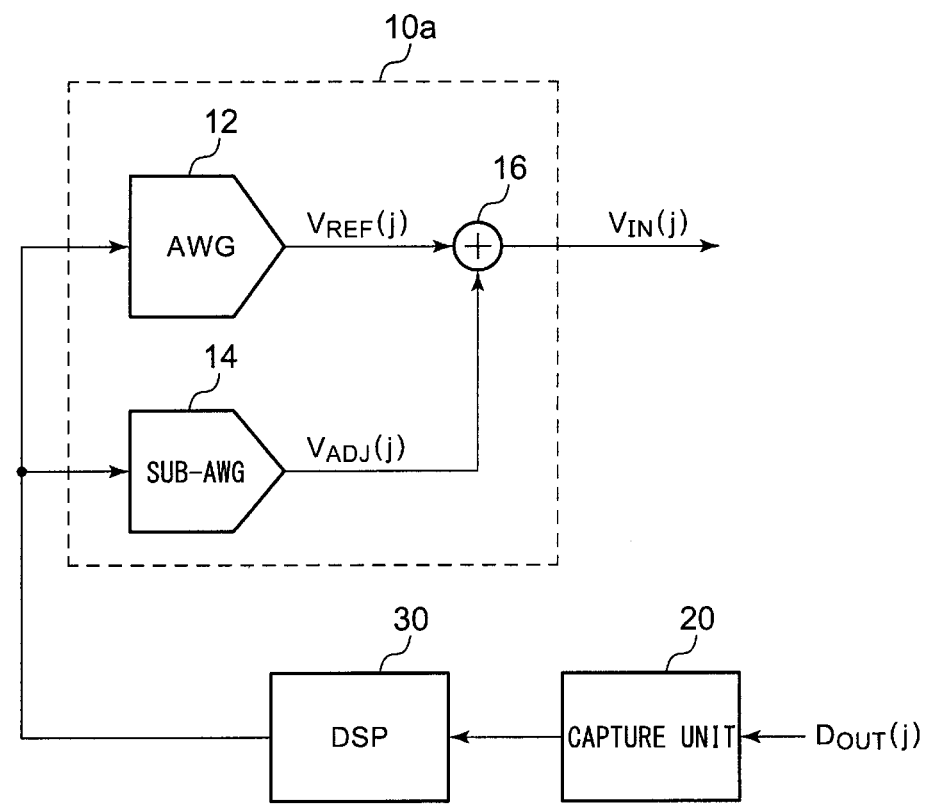
FIG. 6 is a block diagram which shows a configuration of a test apparatus according to a modification.

FIG. 6 is a block diagram which shows a configuration of a test apparatus 2a according to a modification. A voltage generating unit 10a includes a main voltage source 12, a sub-voltage source 14, and an adder 16. The main voltage source 12 is configured to generate a $2^N$-valued reference analog voltage $V_{REF}$(1 to $2^N$) in which the voltage difference between adjacent levels is $\Delta V$. With such an arrangement, $V_{REF}(j)$ is represented by $\Delta V \times j$.

The sub-voltage source 14 is configured to generate a corrected voltage $V_{ADJ}'(j)$ that corresponds to the correction amount determined by the signal processing unit 30 for each level j. The adder 16 is configured to add the reference analog voltage $V_{REF}(j)$ and the correction voltage $V_{ADJ}'$, and to output the analog voltage $V_{IN}(j)$ thus corrected.

$$V_{IN}(j) = V_{REF}(j) + V_{ADJ}'(j)$$

For example, in the example shown in FIG. 5B, the correction voltages $V_{ADJ}'$ for the first through third corrections are $-½ \times \Delta V$, $-¼ \times \Delta V$, and $-⅜ \times \Delta V$, respectively.

With such a configuration shown in FIG. 6, such an arrangement includes two separate voltage sources, i.e., a voltage source configured to generate the analog reference voltage $V_{REF}$ with a coarse resolution and a voltage source configured to generate the correction voltage $V_{ADJ}'$ with a fine resolution. This allows the two such voltage sources to be designed and optimized separately to have suitable respective resolutions. Thus, such an arrangement provides the analog voltage $V_{IN}$ with improved resolution while reducing the size of the voltage generating unit 10a. Furthermore, such an arrangement allows the signal processing unit 30 to perform signal processing in a simple manner.

Figure 7A:
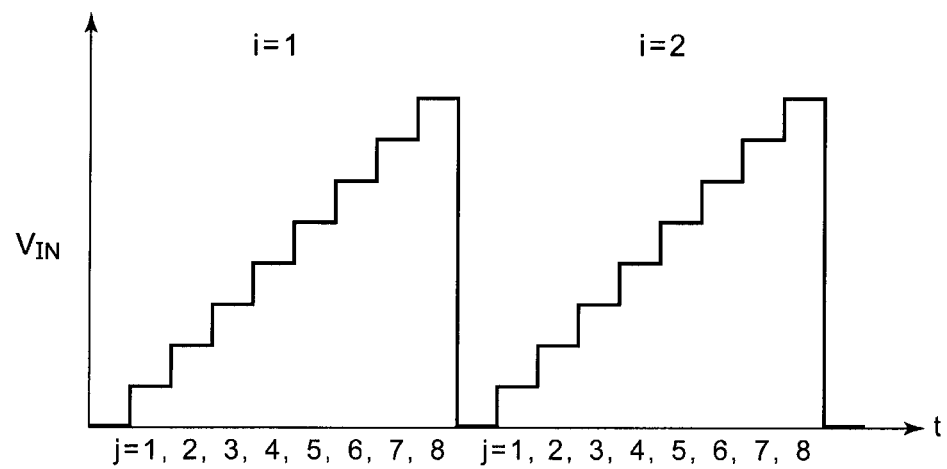
FIGS. 7A and 7B are diagrams respectively showing an analog voltage which increases monotonically and an analog voltage which is generated in a scrambled manner.
Figure 7B:
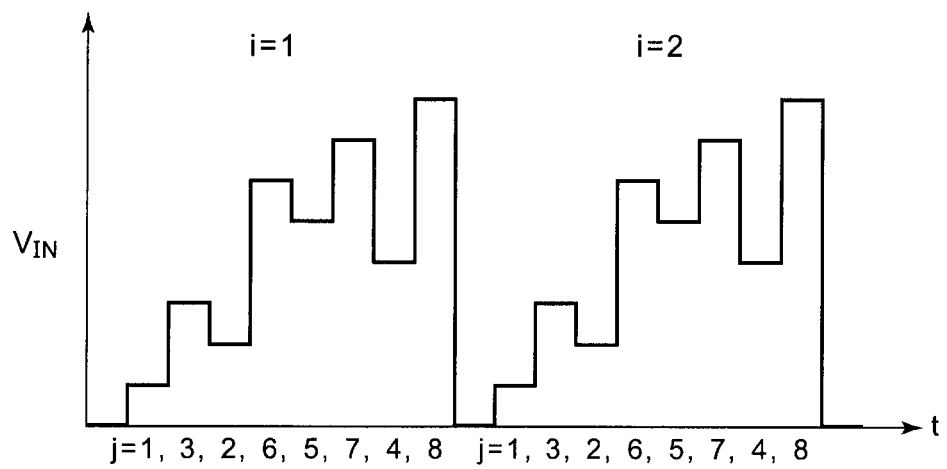

The voltage generating unit 10 may generate the $2^N$-valued analog voltage $V_{IN}$ in a scrambled manner such that the analog voltage $V_{IN}$ does not increase monotonically. FIGS. 7A and 7B are diagrams respectively showing the analog voltage $V_{IN}$ which increases monotonically and the analog voltage $V_{IN}$ which is generated in a scrambled manner. By outputting the analog voltage $V_{IN}$(1 to 8) in a temporally scrambled manner as shown in FIG. 7B, such an arrangement allows the A/D converter 1 to be tested under stricter conditions. It should be noted that the analog voltage levels to be scrambled may be generated in the same order for every cycle as shown in FIG. 7B. Alternatively, with another embodiment, the analog voltage levels to be scrambled may be generated in a different order for each cycle (i).

Figure 8:
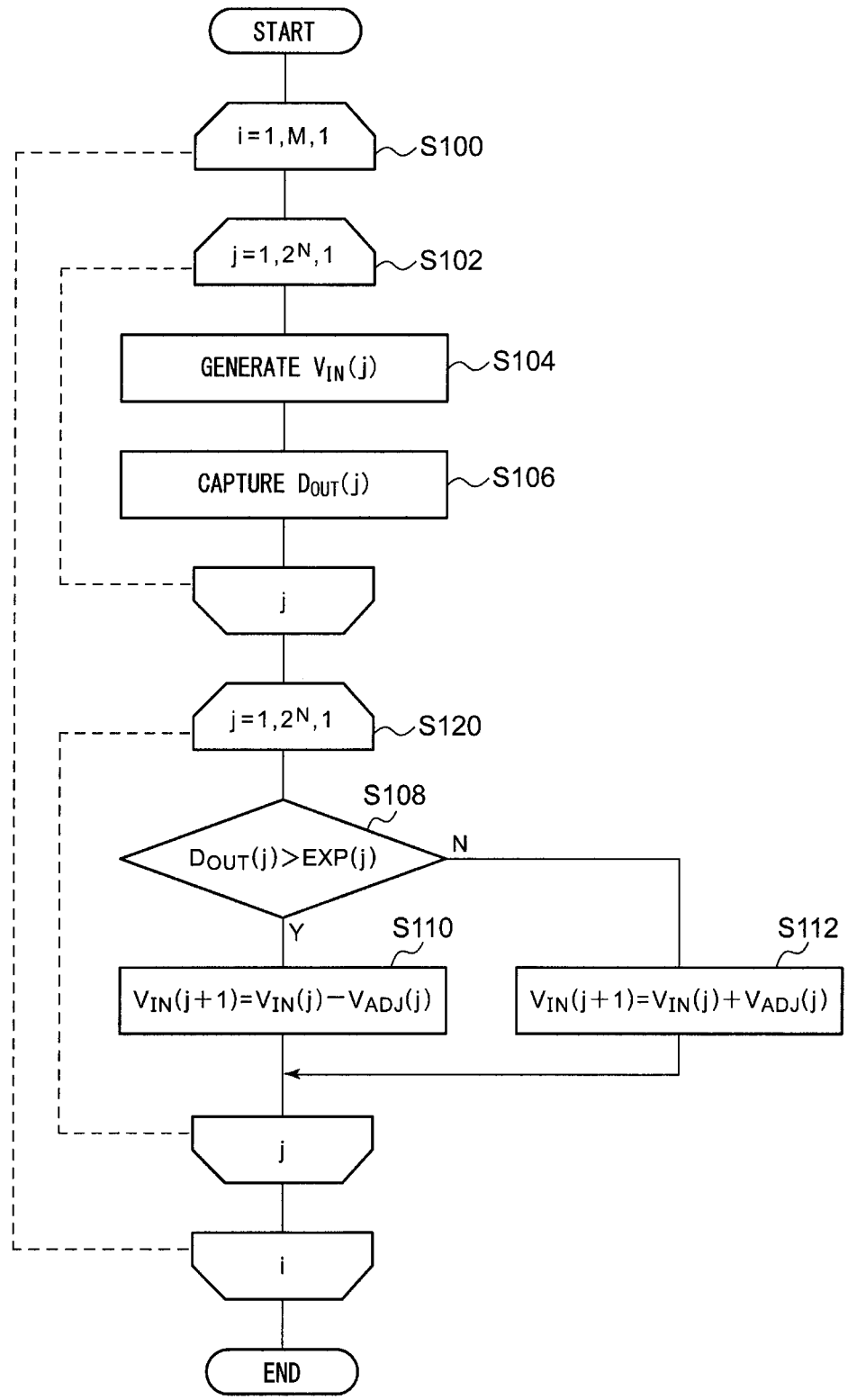
FIG. 8 is a flowchart which shows a modification of a test method employed by the test apparatus shown in FIG. 2.

FIG. 8 is a flowchart which shows a modification of a test method employed in the test apparatus shown in FIG. 2. With such a modification, the steps S108 through S112 shown in FIG. 4 are executed outside of the loop S102. That is to say, the digital codes $D_{OUT}$(j) are captured for all the levels ($1 \leq j \leq 2^N$) (S104 and S106). With such an arrangement, the signal processing unit 30 does not involve the processing within the loop S102.

After the digital codes $D_{OUT}$ are captured for all the levels, the analog voltages $V_{IN}$(j) to be supplied to the DUT 1 for the next cycle (i+1) are calculated in a batch for all the levels ($1 \leq j \leq 2^N$) (S120). Specifically, such an arrangement executes the Steps S108, S110, and S112 shown in FIG. 4, each time incrementing the variable j.

With such an operation shown in FIG. 4, such an arrangement executes the steps S108, S110, and S112 every time the digital code $D_{OUT}$ is captured for each level. This requires that data be transmitted ($M \times 2^N$) times from the capture unit 20 to the signal processing unit 30 and that data be transmitted ($M \times 2^N$) times from the signal processing unit 30 to the voltage generating unit 10. The time required for data transmission (overhead time $\tau c_{OH}$) becomes large to a degree that cannot be ignored.

In contrast, with such a method according to a modification shown in FIG. 8, the digital codes $D_{OUT}$ for all the levels are transmitted from the capture unit 20 to the signal processing unit 30 in a single batch (burst transmission), the analog voltages to be supplied in the next cycle are calculated for all the levels in a single batch, and burst transmission is performed from the signal processing unit 30 to the voltage generating unit 10 in which the data thus calculated for all the levels is transmitted from the signal processing unit 30 to the voltage generating unit 10 in a single batch. In general, such burst transmission in which multiple words are transmitted consecutively provides far higher time use efficiency than that of data transmission in units of words. Thus, as provided by such a modification shown in FIG. 8, the number of times data is transmitted is reduced to M times, thereby dramatically reducing the overhead time required for the data transmission as compared with the operation shown in FIG. 4.

Such a modification configured to provide reduced overhead time is also advantageous as compared with a comparison technique described below. With such a comparison technique, binary searching is performed for each level. Specifically, the following processing is performed for each level.

A tentative maximum voltage Vt and a tentative minimum voltage Vb are set for the threshold voltage Vth to be measured. Next, the correct threshold voltage Vth is determined by binary searching while the analog voltage $V_{IN}$ is changed between the two voltages Vt and Vb. With such an arrangement, this processing is repeatedly performed for all the levels. Such an operation for all the levels requires capturing to be performed ($2^N \times M$) times, which is the same number of times as that shown in FIG. 4 or FIG. 8. It should be noted that such a comparison technique provides a resolution of (Vt−Vb)/$2^M$.

Such a comparison technique is capable of providing the same degree of resolution by performing capturing the same number of times as in the signal processing shown in the flowchart in FIG. 4 or FIG. 8. However, such a comparison technique requires data transmission between the capture unit 20 and the signal processing unit 30 and data transmission between the signal processing unit 30 and the voltage generating unit 10 every time the digital code $D_{out}$ is captured. That is to say, with such a comparison technique, processing involving the signal processing unit 30 is performed a total of ($2^N \times M$) times, in the same way as shown in the flowchart in FIG. 4. Thus, such an operation shown in the flowchart in FIG. 8 also provides reduced overhead time required for data transmission as compared with such a comparison technique.

Description has been made in the embodiment regarding binary searching as a specific example. However, the present invention is not restricted to such an arrangement. Also, other algorithms may be employed, examples of which include a search method using the golden section ratio.

Description has been made in the embodiment regarding an arrangement employing the expected value code EXP(j) set to (j−1). Also, the expected value code EXP(j) may be set to j. With such an arrangement, when the output code $D_{OUT}$(j) is smaller than the expected value code EXP(i) in the i-th correction, the input voltage $V_{IN}$ to be applied in the (i+1)-th correction should be raised. On the other hand, when the output code $D_{OUT}$(j) is equal to or greater than the expected value code EXP(i) in the i-th correction, the input voltage $V_{IN}$ to be applied in the (i+1)-th correction should be reduced.

In other words, in the correction for correcting the threshold voltage $V_{TH}$(j+1) that defines the boundary between the j-th code and the (j+1)-th code, when the output code $D_{OUT}$(j) is equal to or smaller than the j-th code in the i-th correction, the input voltage $V_{IN}$ to be supplied in the (i+1)-th correction should be raised, and when the output code $D_{OUT}$(j) is equal to or greater than the (j+1)-th code, the input voltage $V_{IN}$ to be supplied in the (i+1)-th correction should be reduced.

While the preferred embodiments of the present invention have been described using specific terms, such description is for illustrative purposes only, and it is to be understood that changes and variations may be made without departing from the spirit or scope of the appended claims.

What is claimed is:

1. A test apparatus for an N-bit (N represents an integer) A/D converter, the test apparatus comprising:
   a voltage generating unit configured to output a $2^N$-valued analog voltage to the A/D converter;
   a capture unit configured to capture an output code for each level output from the A/D converter; and
   a signal processing unit configured to compare the output code captured for each level with a corresponding expected value code, to correct the value of an analog voltage for each level based upon the comparison result, and to output the corrected analog voltage to the voltage generating unit.

2. A test apparatus according to claim 1, wherein, in the i-th (i represents an integer) correction, the analog voltage to be supplied in the (i+1)-th correction for a given level is reduced or otherwise is increased according to the comparison result between the output code captured for this level and the corresponding expected value code.

3. A test apparatus according to claim 2, wherein, in an initial state, each difference between adjacent levels in the analog voltage is set to a constant value, i.e., $\Delta V$, and wherein the signal processing unit is configured to execute an i-th (i represents an integer) correction in which the analog voltage to be supplied in the (i+1)-th correction for a given level is reduced or otherwise is increased by $\Delta V/2^i$ based upon comparison result between the output code captured for this level and the corresponding expected value code.

4. A test apparatus according to claim 2, wherein the signal processing unit is configured to repeatedly perform the correction for the analog voltage until a desired resolution is obtained.

5. A test apparatus according to claim 3, wherein the signal processing unit is configured to repeatedly perform the correction for the analog voltage until a desired resolution is obtained.

6. A test apparatus according to claim 1, wherein the voltage generating unit comprises:
a main voltage source configured to generate a $2^N$-valued reference analog voltage in which the voltage difference between adjacent levels is set to $\Delta V$;
a sub-voltage source configured to generate a correction voltage that corresponds to a correction amount determined for each level by means of the signal processing unit; and
an adder configured to add the reference analog voltage and the correction voltage so as to output a corrected analog voltage.

7. A test apparatus according to claim 1, wherein the voltage generating unit is configured to generate the $2^N$-valued analog voltage such that it increases monotonically.

8. A test apparatus according to claim 1, wherein the voltage generating unit is configured to generate the $2^N$-valued analog voltage in a scrambled manner.

9. A test method for an N-bit (N represents an integer) A/D converter, the test method comprising:
outputting a $2^N$-valued analog voltage to the A/D converter each time incrementing a variable i (i represents an integer);
capturing an output code for each level output from the A/D converter; and
comparing the output code captured for each level with a corresponding expected value code, and correcting the value of the analog voltage for each level according to the comparison result,
wherein the aforementioned processing is repeatedly executed.

10. A method according to claim 9, wherein, in an i-th correction, the analog voltage for a given level to be supplied in the (i+1)-th correction is reduced or otherwise is increased according to the comparison result between the output code captured for this level and the corresponding expected value code.

11. A method according to claim 10, wherein, in an initial state, each voltage difference between adjacent levels in the analog voltage is set to be the same value, i.e., $\Delta V$,
and wherein, in an i-th correction, the analog voltage for a given level to be supplied in the (i+1)-th correction is reduced or otherwise is increased by $\Delta V/2^i$ according to the comparison result between the output code captured for this level and the corresponding expected value code.

* * * * *